(12) United States Patent
Shimotori et al.

(10) Patent No.: US 8,488,367 B2
(45) Date of Patent: Jul. 16, 2013

(54) SEMICONDUCTOR MEMORY DEVICE AND METHOD FOR CONTROLLING THE SAME

(75) Inventors: Takafumi Shimotori, Kawasaki (JP);
Yoichi Minemura, Yokkaichi (JP);
Hiroshi Kanno, Yokkaichi (JP);
Takayuki Tsukamoto, Yokkaichi (JP);
Jun Nishimura, Kuwana (JP);
Masahiro Une, Hiroshima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 147 days.

(21) Appl. No.: 13/052,174

(22) Filed: Mar. 21, 2011

(65) Prior Publication Data
US 2011/0235400 A1 Sep. 29, 2011

(30) Foreign Application Priority Data
Mar. 23, 2010 (JP) .................. 2010-067038

(51) Int. Cl.
*G11C 11/00* (2006.01)
(52) U.S. Cl.
USPC ........................................ 365/148; 365/163
(58) Field of Classification Search
USPC ................................................ 365/148, 163
See application file for complete search history.

(56) References Cited

U.S. PATENT DOCUMENTS

2009/0296458 A1* 12/2009 Lee et al. ...................... 365/163
2010/0182820 A1*  7/2010 Kitagawa et al. ............. 365/148
2010/0195370 A1*  8/2010 Shiimoto et al. ............. 365/148

FOREIGN PATENT DOCUMENTS

| JP | 2004/185754   | 7/2004  |
|----|---------------|---------|
| JP | 2006-134398   | 5/2006  |
| JP | 2008-276904 A | 11/2008 |
| JP | 2010-33676    | 2/2010  |
| JP | 2010-182373   | 8/2010  |

OTHER PUBLICATIONS

U.S. Appl. No. 13/018,757, filed Feb. 1, 2011, Takayuki Tsukamoto, et al.
U.S. Appl. No. 12/882,685, filed Sep. 15, 2010, Hiroshi Kanno, et al.
U.S. Appl. No. 12/886,090, filed Sep. 20, 2010, Yoichi Minemura, et al.
U.S. Appl. No. 12/876,637, filed Sep. 7, 2010, Reika Ichihara, et al.
U.S. Appl. No. 13/350,067, filed Jan. 13, 2012, Kanno, et al.

* cited by examiner

*Primary Examiner* — Huan Hoang
(74) *Attorney, Agent, or Firm* — Oblon, Spivak, McClelland, Maier & Neustadt, L.L.P.

(57) ABSTRACT

According to one embodiment, a method for controlling a semiconductor device comprises determining a select bit number for a group of memory cells each includes a variable-resistance element, setting a first voltage corresponding to the select bit number, applying the set first voltage to the memory cell group, and performing verify read on the memory cell group to which the first voltage has been applied and determining whether or not the memory cell group passes the verify read. If the memory cell group is determined not to pass the verify read, the number of bits corresponding to passed memory cells is subtracted from the select bit number, and the first voltage corresponding to the decreased select bit number is set again.

17 Claims, 9 Drawing Sheets

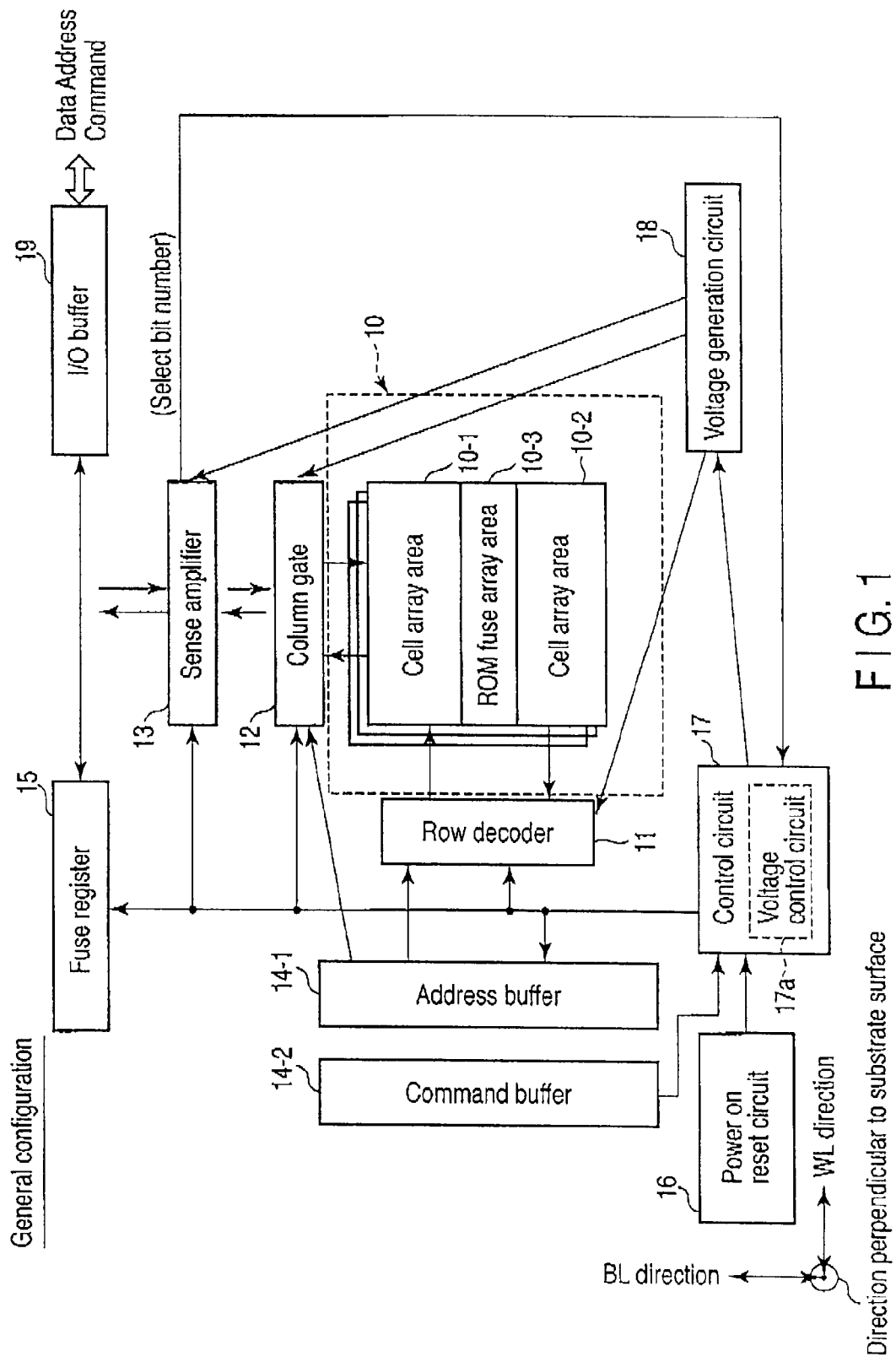
F I G. 1

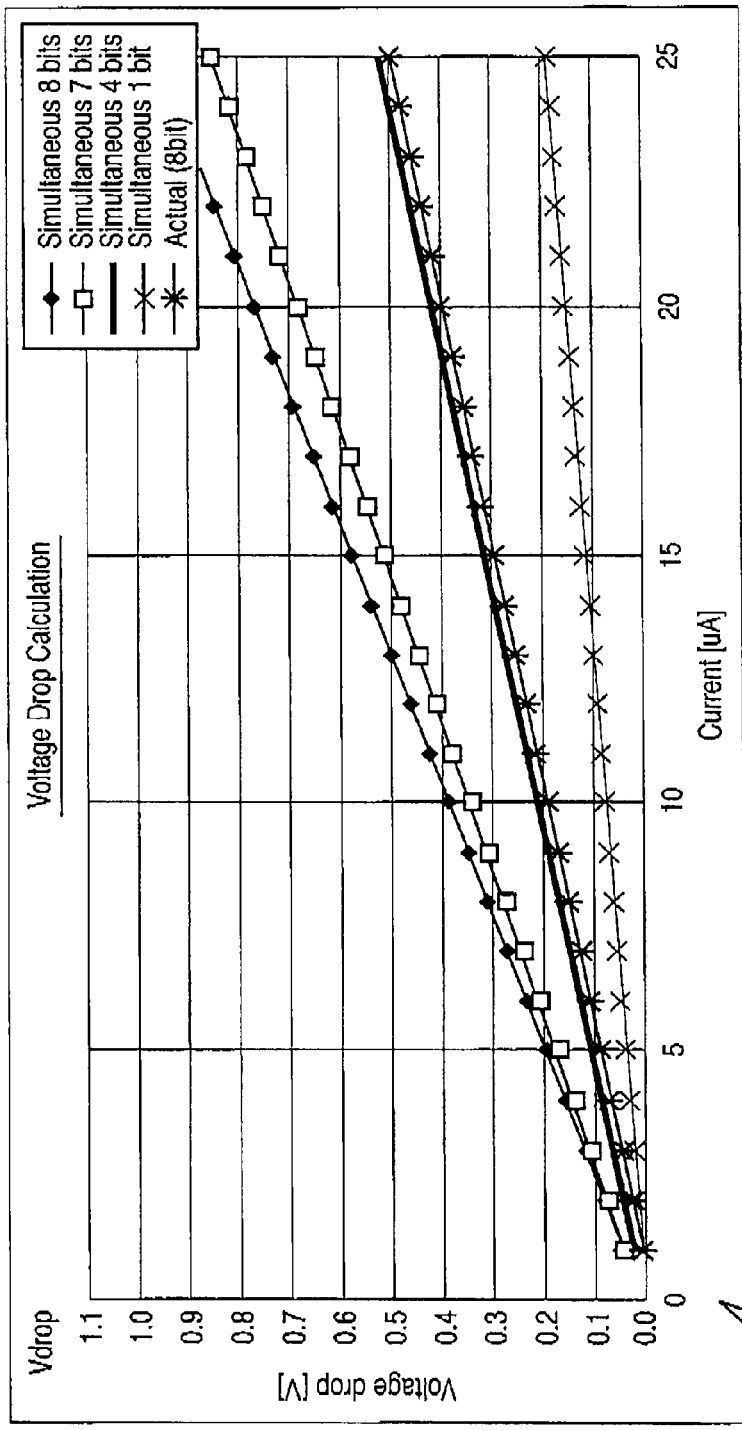
F I G. 7

SEMICONDUCTOR MEMORY DEVICE AND METHOD FOR CONTROLLING THE SAME

CROSS-REFERENCE TO RELATED APPLICATIONS

This application is based upon and claims the benefit of priority from Japanese Patent Application No. 2010-067038, filed Mar. 23, 2010; the entire contents of which are incorporated herein by reference.

FIELD

Embodiments described herein relate generally to a semiconductor device and a method for controlling the semiconductor device.

BACKGROUND

In recent years, much attention has been paid to semiconductor memory devices with resistive memory elements such as resistive random access memories (ReRAMs), phase-change RAMs (PCRAMs), magnetic RAMs or magnetoresistive RAMs (MRAMs), and fuse/anti-fuse RAMs, as candidates for next-generation successors to flash memories that are large-capacity and inexpensive nonvolatile semiconductor memory devices. Much effort has thus been made to develop these memories (see, for example, Jpn. Pat. Appln. KOKAI Publication No. 2008-276904).

For the above-described memories, for example, ReRAMs, a method has been proposed in which control such as data write or data erase is performed on a mass of a plurality of bits. However, the conventional configurations of the above-described memories and the conventional control method may provide low reliability.

BRIEF DESCRIPTION OF THE DRAWINGS

FIG. 1 is a block diagram schematically showing a basic configuration of a semiconductor memory device according to a first embodiment;

FIG. 7 is a diagram illustrating the relationship between a current supplied to a memory cell and a drop in the voltage between a word line and a bit line and in a voltage applied to the memory cell;

DETAILED DESCRIPTION

Figure 2:
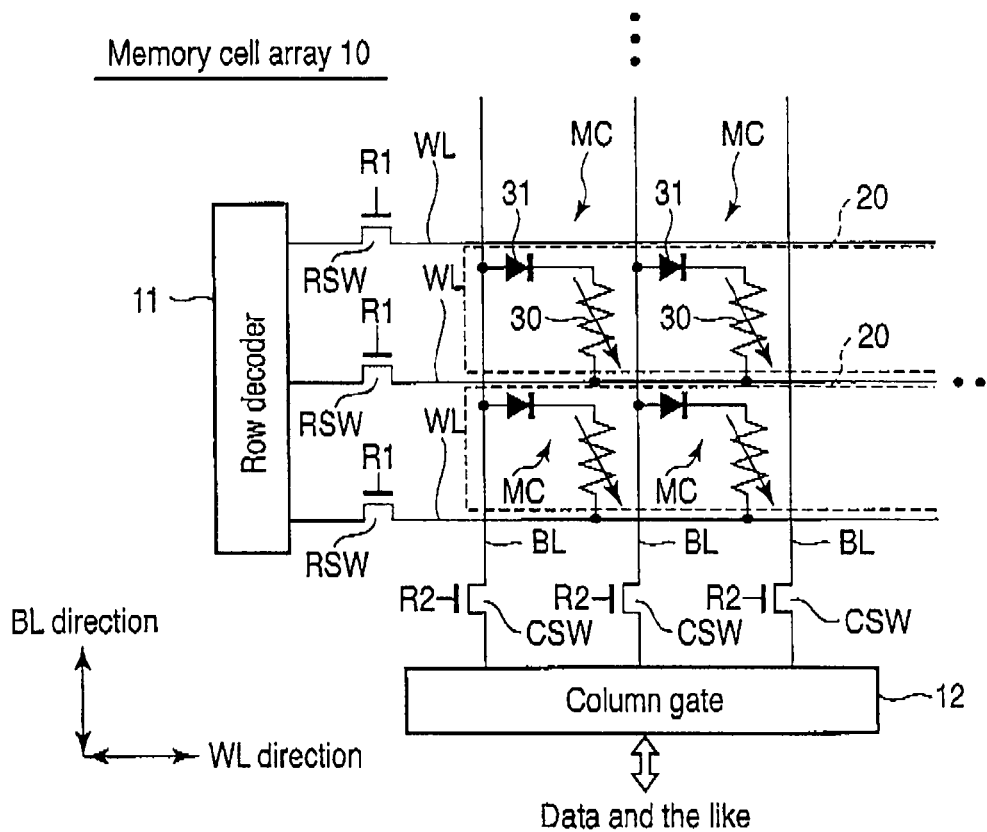
FIG. 2 is a equivalent circuit diagram schematically showing a basic configuration of a cell array according to the first embodiment.

In general, according to one embodiment, a method for controlling a semiconductor device comprises determining a select bit number for a group of memory cells each comprising a variable-resistance element, setting a first voltage corresponding to the select bit number, applying the set first voltage to the memory cell group, and performing verify read on the memory cell group to which the first voltage has been applied and determining whether or not the memory cell group passes the verify read. If the memory cell group is determined not to pass the verify read, the number of bits corresponding to passed memory cells is subtracted from the select bit number, and the first voltage corresponding to the decreased select bit number is set again.

For the memories described in BACKGROUND, for example, ReRAMs, a method has been proposed in which control such as data write or data erase is performed on a mass of a plurality of bits. In such a method, during a data write operation or a data erase operation, the simultaneously selected bits may decrease. If the number of simultaneously selected bits decreases, a current flowing through word lines decreases. This increase a voltage applied to the decreased number of simultaneously selected memory cells. As a result, an extra load is imposed on the memory cell, which may itself be destroyed or may suffer miswriting. In such a case, reliability may be degraded.

Thus, the embodiment will be described in detail with reference to the drawings. In the description, a ReRAM is taken as an example of a semiconductor memory device. However, the present embodiments are not limited to a ReRAM. In the description, common components are denoted by common reference numerals throughout the drawings.

First Embodiment

1. Configuration 1-1. Example of a General Configuration

First, an example of a general configuration of a semiconductor memory device according to a first embodiment will be described.

As shown in FIG. 1, the semiconductor memory device according to the present example comprises a memory cell array 10, a row decoder 11, a column gate 12, a sense amplifier 13, an address buffer 14-1, a command buffer 14-2, a fuse register 15, a power-on reset circuit 16, a control circuit 17, a voltage generation circuit 18, and an I/O buffer 19.

The memory cell array 10 comprises cell array areas 10-1 and 10-2 and a ROM fuse array area 10-3. The cell array areas 10-1 and 10-2 comprise a plurality of memory cells arranged at intersections between word lines and bit lines in a matrix. Furthermore, the memory cell array 10 has a three-dimensional structure in which a plurality of cell arrays are stacked in a direction perpendicular to the substrate surface of the semiconductor substrate.

The row decoder 11 decodes addresses in a row direction (word line direction). Furthermore, the row decoder 11 comprises a drive circuit configured to drive the word lines.

The column gate 12 decodes addresses in a column direction (bit line direction). Furthermore, the column gate 12 comprises a drive circuit configured to drive the bit lines. In the present example, the column gate 12 may be arranged on each of the upper and lower sides of the memory cell array 10 (not shown in the drawings).

The sense amplifier 13 reads data from the memory cells and is electrically connected to the column gate 12, the bit lines, and the control circuit 17. Moreover, in the present example, the sense amplifier 13 may be arranged on each of the upper and lower sides of the memory cell array 10 (not shown in the drawings).

The address buffer 14-1 is electrically connected to the row decoder 11 and the column gate 12 to temporarily hold row addresses and column addresses.

The command buffer 14-2 is electrically connected to the control circuit 17 to temporarily hold control commands.

The fuse register 15 is electrically connected to the I/O buffer 19 via a data bus line to hold required data, for example, management data.

The power-on reset circuit 16 detects power-on of the device to output a reset signal to the control circuit 17.

The voltage generation circuit 18 is electrically connected to the row decoder 11, the column gate 12, and the sense amplifier 13 to supply each of the circuits with the required voltage in accordance with control performed by the control circuit 17.

The I/O buffer 19 is electrically connected to the sense amplifier 13 and the fuse register 15 via data bus lines to temporarily hold data, addresses, and commands from an external source such as a host apparatus.

The control circuit 17 controls the above-described circuits. For example, the control circuit 17 controls the above-described circuits so as to perform data write, data read, and data erase as described below. For example, in the present example, the control circuit 17 determines a select bit number detected in the sense amplifier 13. The control circuit 17 comprises a voltage control circuit 17a. The voltage control circuit 17a controls the voltage generation circuit 18 based on the select bit number from the sense amplifier 13. This control will be described below in detail.

1-2. Example of Configuration of the Memory Cell Array

Now, an example of configuration of the memory cell array 10 according to the present example will be described with reference to FIG. 2. As shown in FIG. 2, the memory cell array 10 has across point structure in which a plurality of memory cells MC are arranged at the intersections between a plurality of bit lines BL and a plurality of word lines WL. In the memory cell array 10 according to the present example, the plurality of memory cells MC are connected to the common word line WL. The memory cell array 10 comprises a memory cell group 20 forming a plurality of bits. In the present example, a data write operation and a data erase operation are performed on a mass of the memory cell group 20.

Each of the memory cells MC comprises a variable-resistance element 30 and a diode 31. One end of a current path in the variable-resistance element 30 is connected to the word line WL. The other end of the current path is connected to a cathode of the diode 31. An anode of the diode 31 is connected to the bit line BL.

One end of each of the word lines WL is connected to the row decoder 11 via a MOS transistor RSW serving as a select switch. One end of each of the bit lines BL is electrically connected to the column gate 12 via a MOS transistor CSW serving as a select switch.

A select signal R allowing one word line (row) to be selected is input to a gate of MOS transistor RSW. A select signal R allowing one bit line (column) to be selected is input to a gate of MOS transistor CSW.

1-3. Example of Configuration of the Memory Cell

Figure 3:
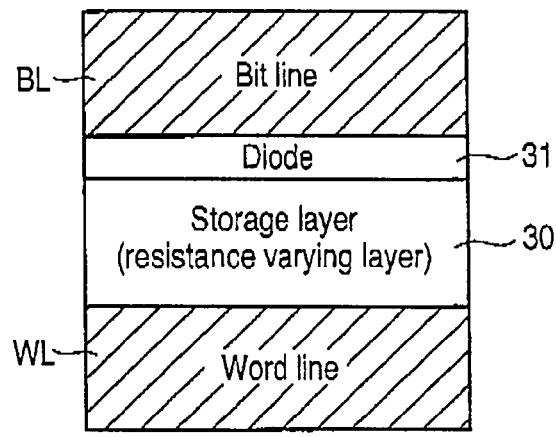
FIG. 3 is a cross-sectional diagram schematically showing a basic configuration of a memory cell according to the first embodiment.

Now, an example of configuration of the memory cell according to the present example will be described with reference to FIG. 3. As shown in FIG. 3, the memory cell according to the present example has a structure in which the diode (non-ohmic element) 31 and the variable-resistance element 30 serving as a storage layer (variable-resistance layer) are stacked between the bit line BL and the word line WL. When a predetermined voltage is applied to the variable-resistance element 30, the state of resistance in the variable-resistance element 30 is changed. The change in resistance condition enables information to be stored.

2. Operation 2-1. Data Write Operation, Data Read Operation, and Data Erase Operation First, a data write operation, a data read operation, and a data erase operation all performed by the semiconductor memory device according to the first embodiment will be described with reference to FIG. 4.

Figure 4:
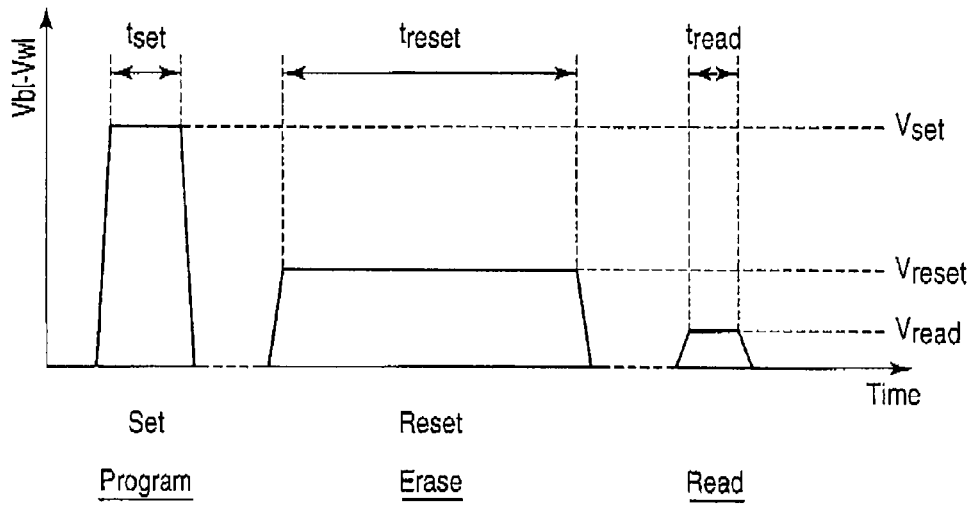
FIG. 4 is a diagram schematically showing examples of basic operations of the semiconductor memory device according to the first embodiment.

As illustrated in FIG. 4, the operation (set operation) of writing data to the memory cell MC may be performed by applying, for a duration tset, a voltage pulse to the variable-resistance element 30 forming the storage layer of the selected memory cell MC to generate a potential gradient Vset in the selected variable-resistance element 30, thus allowing a current to flow through the variable-resistance element 30.

For example, to write data to the selected memory cell. MC, a state is set in which the potential of the selected word line WL is lower than that of the selected bit line BL. If the bit line BL has a fixed potential (for example, about several volts), ground potential may be applied to the word like WL.

The operation (reset operation) of erasing data from the memory cell MC is performed by subjecting the selected variable-resistance element 30 to Joule heating by a large-current pulse during a duration treset to promote an oxidation reduction action in the variable-resistance element 30. The duration treset of the reset operation is longer than the duration tset of the set operation. A voltage Vreset for the reset operation is lower than voltage Vset for the set operation.

The operation of reading data from the memory cell MC is performed by applying a voltage pulse to the selected variable-resistance element 30, for example, for a duration tread, and detecting a current determined by the resistance of the memory cell MC. Here, the voltage pulse desirably has a very small amplitude sufficient to prevent a material forming the variable-resistance element 30 from having its state changed. For example, a read voltage is applied to the selected memory cell MC through the bit line BL. The sense amplifier 13 then measures the resultant current. Additionally, the duration tread of the read operation is shorter than the duration treset of the reset operation. A voltage Vread for the read operation is lower than voltage Vreset for the reset operation.

2-2. Data Write Control

Now, an operation of controlling data write (set) performed by the semiconductor memory device according to the first embodiment will be described along a flow illustrated in FIG. 5.

(S101)

Figure 5:
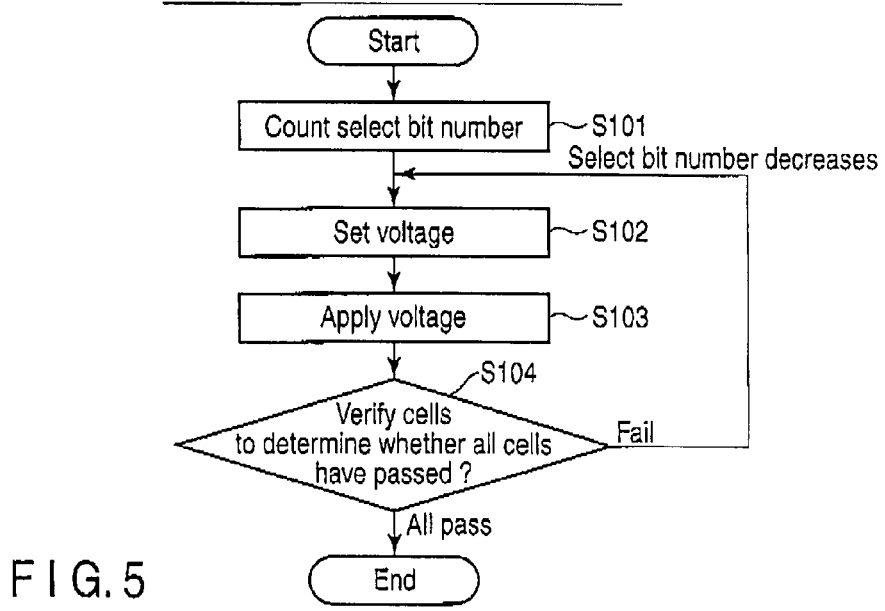
FIG. 5 is a diagram schematically showing the flow of a basic data write (set) control operation of the semiconductor memory device according to the first embodiment.

As Illustrated in FIG. 5, First, in Step S101, for a mass of the memory cell group 20, the control circuit 17 counts (determines) the number of memory cells MC to be selected (select bit number). A write voltage is applied simultaneously to the selected memory cells MC in the memory cell group 20 at once.
(S102)
Subsequently, in Step S102, the Voltage Control circuit 17a sets a write voltage (applied voltage) corresponding to the number of the selected memory cells MC. For example, the write voltage is a voltage pulse for the voltage illustrated in FIG. 4.

The set write voltage is generated by the voltage generation circuit 18 under the control of the voltage control circuit 17a.
(S103)
Subsequently, in Step S103, for the Mass of the memory cell group 20, the voltage control circuit 17a applies the generated write voltage simultaneously to the selected memory cells for a predetermined duration.
(S104)
Subsequently, in step S104, the Control Circuit 17 performs verify read on the memory cell group 20 to which the write voltage has been applied. The control circuit 17 then determines whether or not all read memory cells can pass a predetermined value. The voltage applied for the verify read is a voltage pulse for the voltage illustrated in FIG. 4.

In step S104, if the control circuit 17 determines that all the memory cells have passed the predetermined value (all pass), this operation is ended.

On the other hand, in step 104, upon determining that not all the memory cells have passed the predetermined value (fail), the control circuit 17 subtracts the number of passed bits from the select bit number. The voltage control circuit 17a controls the voltage generation circuit 18 so that the circuit 18 generates a write voltage by reducing the applied voltage in association with the number of the remaining select bits (step S102).

As described above, if the control circuit 17 determines that not all the memory cells have passed the predetermined value (fail), the voltage control circuit 17a receives the decreased select bit number fed back by the sense amplifier 13. In step S102, the voltage control circuit 17a reduces (adjusts) the write voltage in association with the number of memory cells MC (select bit number) corresponding to the select bit number minus the number of the passed memory cells MC.

Subsequently, the reduced write voltage is applied to the select bits again (S103). When step S103 is carried out again, the passed memory cells are masked so that the write voltage is not applied to these memory cells.

Thereafter, a similar operation is repeated. When all the selected memory cells (select bits) pass the verify read, this data write control operation is ended (End).

2-3. Specific Example of Setting of the Write Voltage

Now, with reference to FIG. 6, a specific example of setting of the write voltage will be described; in the example, in step S104 described above, if the control circuit 17 determines that not all the memory cells have passed the predetermined value (fail), the write voltage is set again so as to be generated by reducing the applied voltage in association with the remaining select bit number. FIG. 6(a) illustrates the relationship between time and a current IW1 flowing through the word line. FIG. 6(b) illustrates the relationship between time and voltage Vw1−Vb1 between the word line and the bit lie. FIG. 6(c) illustrates the relationship between time and a voltage Vcell applied to one memory cell in the memory cell group 20. In the present example, the select bit number for the memory cell group 20 is 8 bits by way of example.

Figure 6:
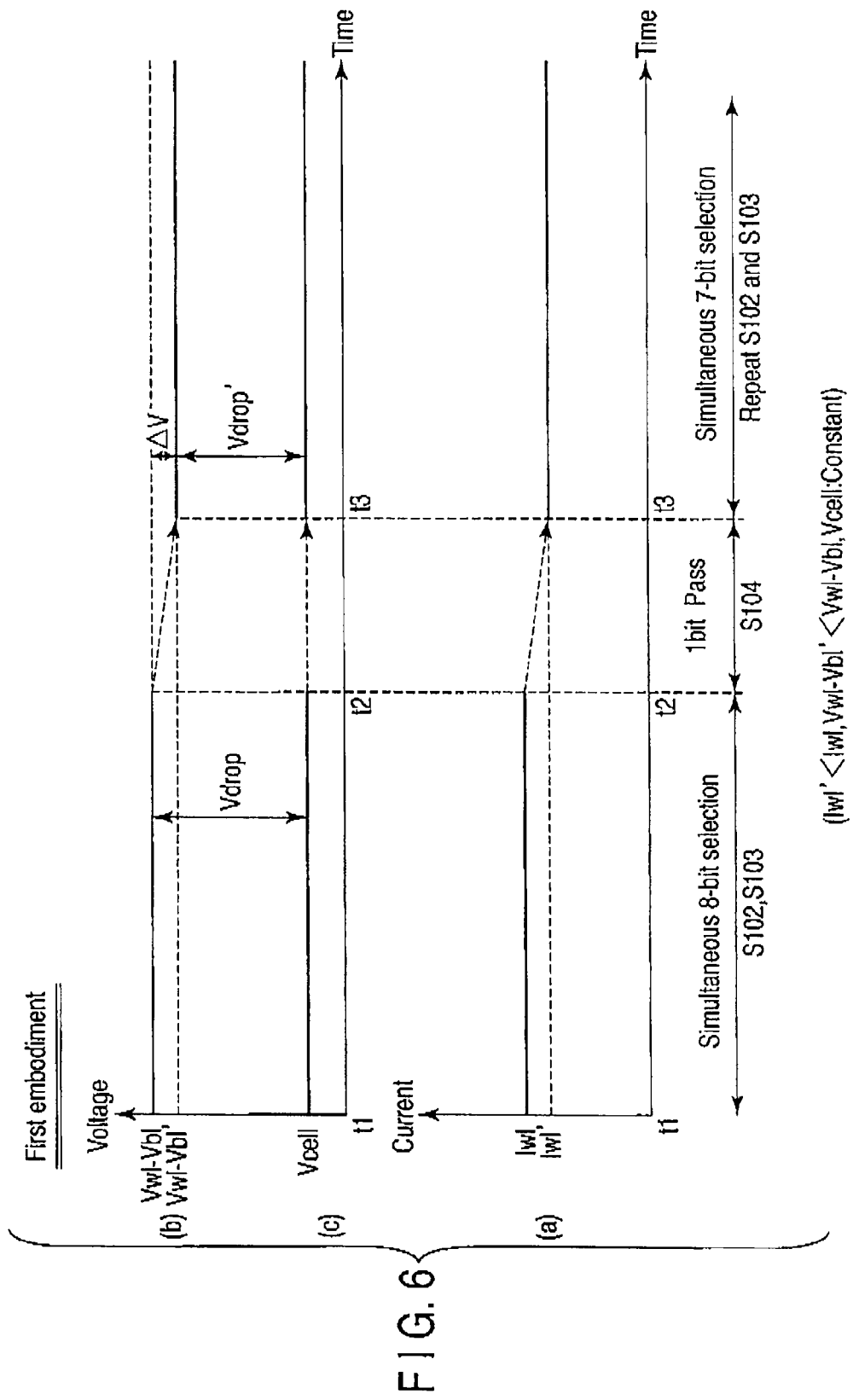
FIG. 6 is a diagram illustrating a specific example of write voltage setting in the semiconductor memory device according to the first embodiment.

As illustrated in FIG. 6, first, at time t1 (simultaneous 8-bit selection), as a result of step S102 and S103 described above, the following take place. (a) Current Iw1 flows through the word line. (b) Voltage Vw1−Vb1 is applied between the word line and the bit line. (c) Voltage Vcell is applied to one memory cell in the memory cell group 20.

It is assumed that subsequently between time t2 and time t3, the determination in step S104 indicates that the 1 bit has passed verification (1 bit pass). Then, if the memory cells to be simultaneously selected are located on the same word line as in the present example, then at time t3, (a) the magnitude Iw1' of a current flowing through the word line decreases discreetly (Iw1<Iw1'). In connection with current Iw1', the voltage drop varies in proportion to wire resistance originally possessed by the circuit. In the present example, in connection with current Iw1', a decrease in select bit number from 8 bits to 7 bits results in a voltage drop.

Thus, in the present example, (b) the number of the passed bits is subtracted from the select bit number. The voltage control circuit 17a controls the voltage generation circuit 18 so that the circuit 18 generates a write voltage (Vw1−Vb1'<Vw1−Vb1') by reducing the applied voltage in association with the remaining select bit number (7 bits). The voltage control circuit 17a further sets and applies the write voltage again (steps S102 and S103).

As a result, (c) even if the simultaneous 8-bit selection changes to the simultaneous 7-bit selection, the constant voltage Vcell can be applied to one memory cell in the memory cell group 20. Thus, even with a change in the number of bits in the memory cells to be selected, the present embodiment can prevent a possible extra load on the memory cell, which may lead to destruction of the memory cell itself or miswriting to the memory cell. This advantageously allows reliability to be improved.

If the simultaneous 8-bit selection changes to the simultaneous 7-bit selection, a drop voltage Vdrop that is the difference between voltage Vw1−Vb1 and voltage Vcell also decreases.

3. Advantageous Effects

As described above, the semiconductor memory device and the method for controlling the semiconductor memory device according to the first embodiment exert at least an effect described in (1).

(1) Reliability can be improved.

The semiconductor memory device according to the first embodiment comprises the memory cell array 10 in which the group 20 of the memory cells each comprising the variable-resistance element is arranged, the voltage generation circuit 18 configured to generate at least the write voltage for the memory cell array 10, and the control circuit 17 configured to carrying out step S101 of counting the select bit number for the memory cell group 20, step S102 of setting the write voltage corresponding to the counted select bit number, step S103 of applying the set write voltage to the memory cell group 20, and step S104 of performing verify read on the memory cell group 20 to which the write voltage has been applied to determine whether or not all of the select bits pass the verify read, wherein upon determining in step S104 that not all the select bits can pass the verify read, the control circuit 17 controls the memory cell array 10 and the voltage generation circuit 18 so that step S102 is carried out again with the number of passed bits subtracted from the select bit number to reduce the applied voltage.

For example, as illustrated in FIG. 6, in the present example, at time t3, when (a) current Iw1' flowing through the word line decreases discreetly (Iw1<Iw1'), the following take place. (b) The number of the passed bits is subtracted from the select bit number. The voltage control circuit 17a controls the voltage generation circuit 18 so that the circuit 18 generates a write voltage (Vw1-Vb1'<Vw1-Vb1') by reducing the applied voltage in association with the remaining select bit number (7 bits). The voltage control circuit 17a further sets and applies the write voltage again (steps S102 and S103).

As a result, (c) even if the simultaneous 8-bit selection changes to the simultaneous 7-bit selection, the constant voltage Vcell can be applied to one memory cell in the memory cell group 20. Thus, even with a change in the number of bits in the memory cells to be selected, the present embodiment can prevent a possible extra load on the memory cell, which may lead to destruction of the memory cell itself or miswriting to the memory cell. This advantageously allows reliability to be improved. Furthermore, the controlled voltage allows the resistance of the memory cell to be made closer to the target value (which corresponds to, for example, the data write state). This facilitates the control of the next voltage application operation (for example, the operation of shifting the data write state to the data erase state) to be performed on the memory cell (that is, the next voltage application operation is more quickly achieved). Thus, the present embodiment advantageously allows the memory cells to be more properly controlled.

The setting of the write voltage will be more specifically described with reference to FIG. 7. Here, the drop voltage Vdrop, the voltage drop ((Vw1-Vb1)-Vcell) between voltage Vw1-Vb1 and voltage Vcell, is taken as an example.

As described above, a decrease in select bit number reduces the current flowing through the word line WL, while increasing the voltage applied to the memory cell MC (about 0.1 V). In this case, the voltage applied to the memory cell MC deviates from the target value. Hence, the voltage applied through the bit line needs to be adjusted depending on the select bit number.

Thus, as illustrated in FIG. 7, for example, if the simultaneous select bit number is 8 bits, the write voltage is set to about 5.00 V. If the simultaneous select bit number becomes 4 bits, the write voltage is set to about 4.80 V. If the simultaneous select bit number becomes 1 bit, the write voltage is set to about 4.65 V. In this manner, in response to a decrease in select bit number, a possible decrease in the current flowing through the word line is inhibited. This enables suppression of a possible increase in the voltage applied to the memory cell.

Second Embodiment

Figure 8:
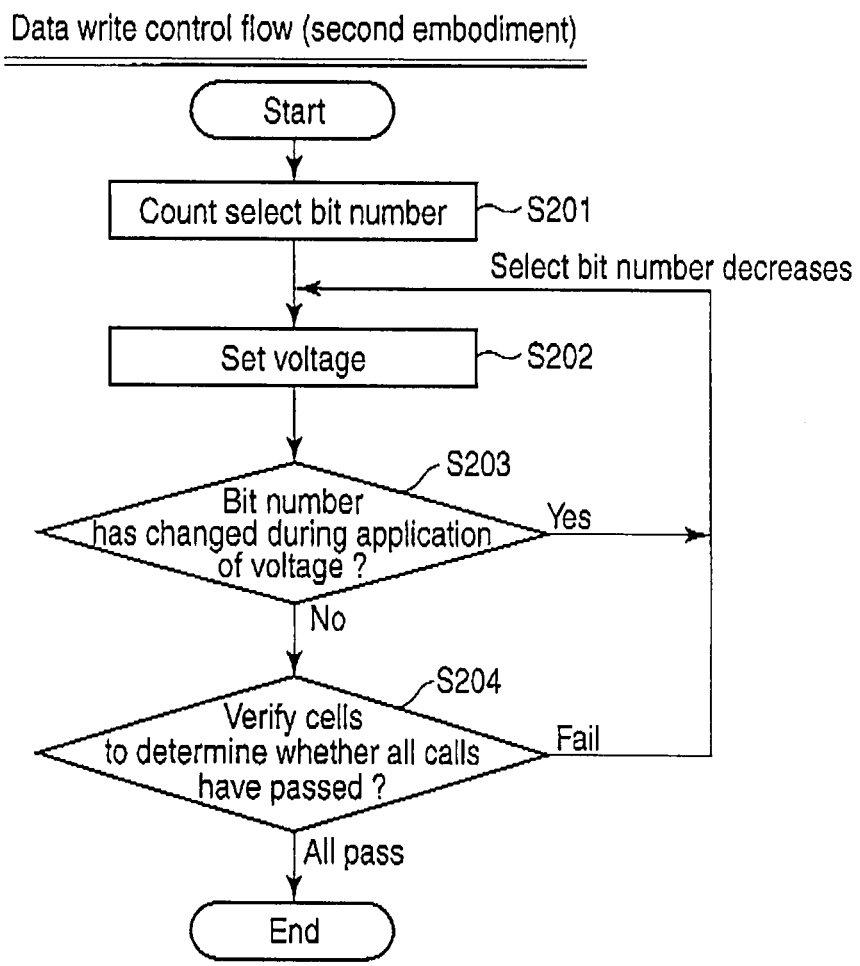
FIG. 8 is a diagram schematically showing the flow of a basic data write (set) control operation of a semiconductor memory device according to a second embodiment.

Now, a semiconductor memory device and a method for controlling the semiconductor memory device according to a second embodiment will be described with reference to FIG. 8 and FIG. 9. In the description, contents that overlap between the first embodiment and the second embodiment are omitted.

Configuration Example

The second embodiment is different from the first embodiment in that the sense amplifier 13 further comprises a detection circuit (not shown in the drawings) configured to automatically detect a current flowing through each bit line.

The detection circuit automatically determines whether or not simultaneously selected memory cells have passed verification, while a voltage is being applied to the simultaneously selected memory cells during a data write operation.
<Data Write Control>

Now, an operation of controlling data write (set) performed by the semiconductor memory device according to the second embodiment will be described along a flow in FIG. 8.
(S203)

In the present example, in step S203, when in a mass of the memory cell group 20, a generated write voltage is applied to selected memory cells for a predetermined duration, the voltage control circuit 17a automatically determines whether or not the selected memory cells have passed verification.

If the selected memory cells (select bits) are determined, during a predetermined duration, to have passed the verification (Yes), the number of bits having passed the verification is subtracted from the select bit number (select bit number decreases). Then, step S202 is carried out again.

On the other hand, if the selected memory cells (select bits) are determined, during the predetermined duration, not to have passed the verification (No), the process proceeds to step S204.

Specific example of setting of the write voltage

Now, with reference to FIG. 9, a specific example of setting of the write voltage will be described; in the example, in step S204 described above, if the device determines that not all the memory cells have passed the predetermined value (fail), the write voltage is set again so as to be generated by reducing the applied voltage in association with the remaining select bit number. FIG. 9(a) illustrates the relationship between time and current Iw1 flowing through the word line. FIG. 9(b) illustrates the relationship between time and voltage Vw1-Vb1 between the word line and the bit line. FIG. 9(c) illustrates the relationship between time and voltage Vcell applied to one memory cell in the memory cell group 20. In the present example, the select bit number for the memory cell group 20 is 8 bits by way of example.

Figure 9:
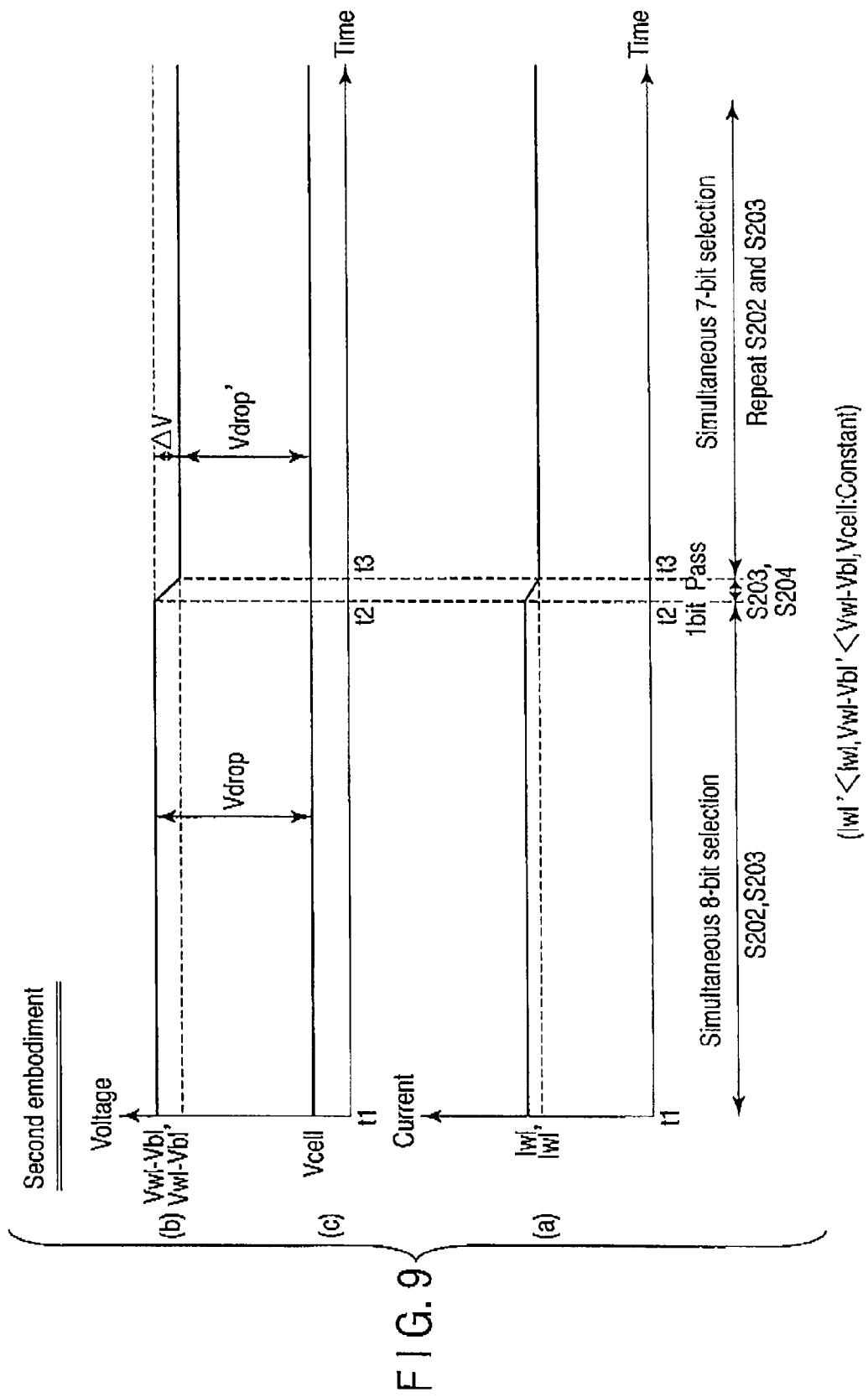
FIG. 9 is a diagram illustrating a specific example of write voltage setting in the semiconductor memory device according to the second embodiment.

As illustrated in FIG. 9, the present example is different from the above-described first embodiment in that during the predetermined duration between time t2 and time t3, the detection circuit automatically determines whether or not the simultaneously selected memory cells have passed verification, while a voltage is being applied to the selected memory cells (S203).

It is assumed that during the predetermined duration, the determination in step S203 indicates that 1 bit has passed the verification (1 bit pass). Then, as described above, at time t3, (a) the magnitude Iw1' of the current flowing through the word line decreases discreetly (Iw1<Iw1'). In the present example, in connection with current Iw1', a decrease in select bit number from 8 bits to 7 bits results in a voltage drop.

Thus, in the present example, step S203 is carried out again without proceeding to step S204. Then, (b) the number of the passed bits is subtracted from the select bit number. The voltage control circuit 17a controls the voltage generation circuit 18 so that the circuit 18 generates a write voltage (Vw1-Vb1'<Vw1-Vb1') by reducing the applied voltage in association with the remaining select bit number (7 bits). The voltage control circuit 17a applies the reset write voltage (step S203).

As a result, for example, even if the simultaneous 8-bit selection changes to the simultaneous 7-bit selection during application of the write voltage (S203), the constant voltage Vcell can be applied. Thus, in the present example, even with a change in the number of bits in the select memory cells during application of the write voltage (S203), the present embodiment can prevent a possible extra load on the memory cell, which may lead to destruction of the memory cell itself or miswriting to the memory cell. This advantageously allows reliability to be improved. Furthermore, the controlled voltage allows the resistance of the memory cell to be made closer to the target value. This facilitates the control of the next voltage application operation to be performed on the memory cell. Thus, the present embodiment advantageously allows the memory cells to be more properly controlled.

Advantageous effects

The above-described second embodiment exerts at least the above described effect (1). In addition, according to the present example, an effect in (2) can be exerted.

(2) Even with a change in the number of bits in the select memory cells during application of the write voltage, reliability can advantageously be improved.

In the present example, the sense amplifier 13 further comprises the detection circuit (not shown in the drawings) configured to automatically detect the current flowing through each bit line. The detection circuit automatically determines whether or not simultaneously selected memory cells have passed verification, while a voltage is being applied to the simultaneously selected memory cells during a data write operation.

Thus, even with a change in the number of bits in the select memory cells during application of the write voltage (S203), the present embodiment can prevent a possible extra load on the memory cell, which may lead to destruction of the memory cell itself or miswriting to the memory cell. This advantageously allows reliability to be improved.

Comparative Example 1

Now, for comparison with the above-described first embodiment, a data write control operation of a semiconductor memory device according to Comparative Example 1 will be described with reference to FIG. 10.

Figure 10:
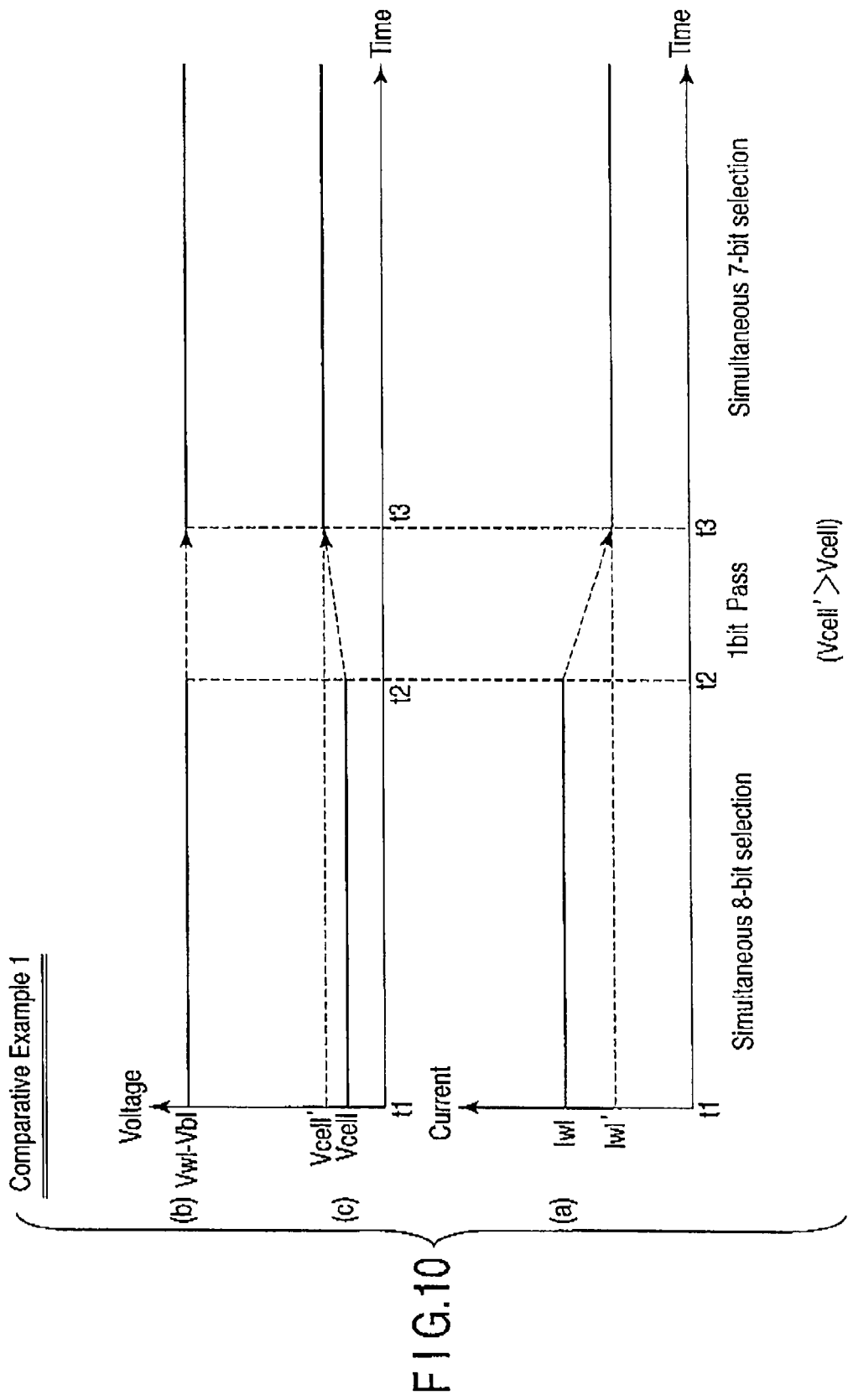
FIG. 10 is a diagram illustrating a specific example of write voltage setting in a semiconductor memory device according to Comparative Example 1.

As shown in FIG. 10, it is assumed that at time t2, the device determines that for example, 1 bit has passed verification (1 bit pass).

Subsequently at time t3, (a) the magnitude Iw1' of the current flowing through the word line decreases discreetly (Iw1<Iw1'). In connection with current Iw1', a decrease in select bit number from 8 bits to 7 bits results in a voltage drop.

However, in Comparative Example 1, the write voltage is not set by feeding back the reduced bit number. Thus, (b) voltage Vw1−Vb1 applied between the word line and the bit line is kept constant. As a result, (c) the voltage applied to each of the simultaneously selected memory cells increases to Vcell' (Vcell'>Vcell).

Consequently, an extra load may be imposed on the memory cell, leading to destruction of the memory cell itself or miswriting to the memory cell. This disadvantageously degrades reliability. More specifically, the voltage applied to the memory cell increases to make the resistance of the memory cell higher or lower than the target value. This may result in a phenomenon such as overwrite or overerase.

Comparative Example 2

Now, for comparison with the above-described second embodiment, a data write control operation of a semiconductor memory device according to Comparative Example 2 will be described with reference to FIG. 11.

Figure 11:
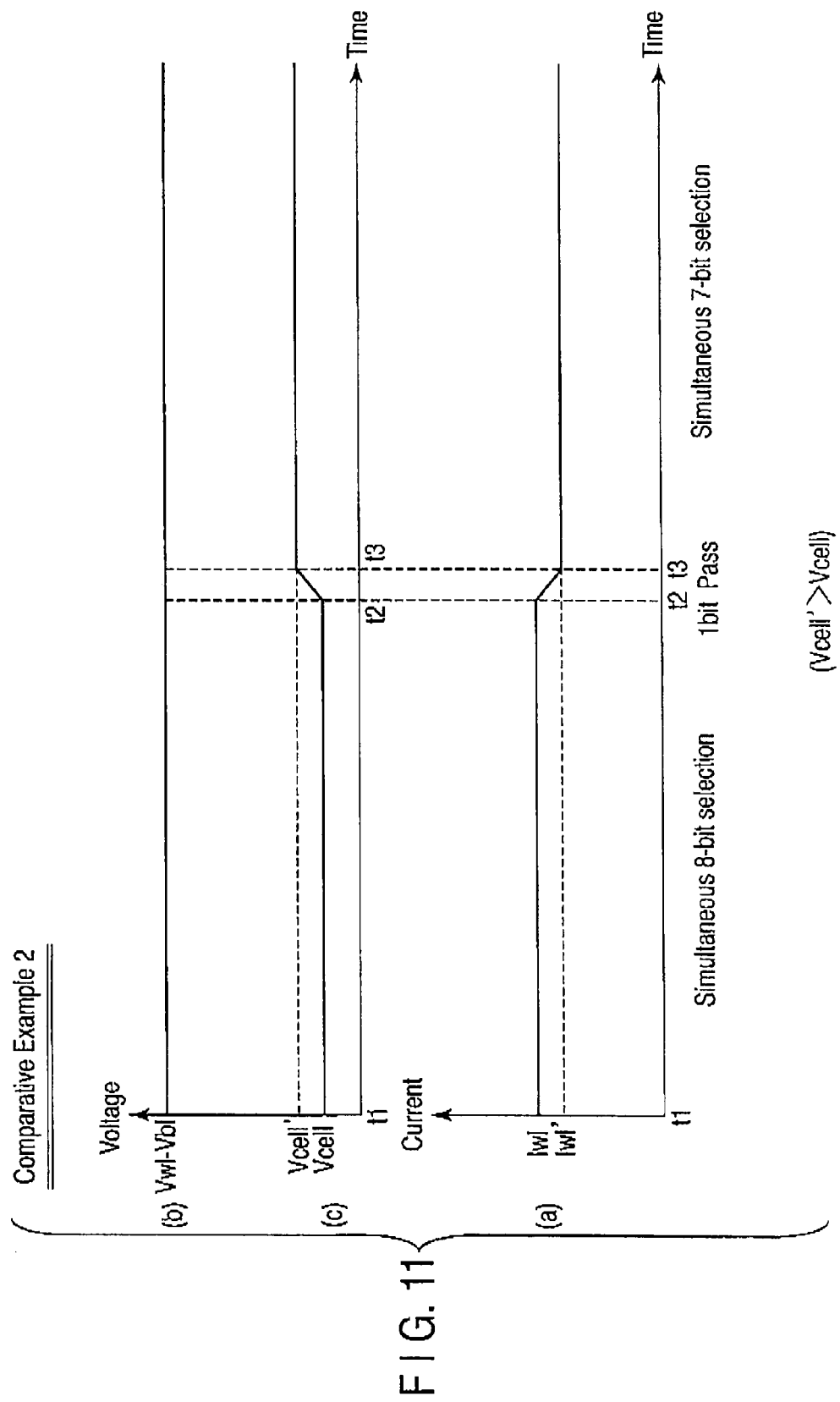
FIG. 11 is a diagram illustrating a specific example of write voltage setting in a semiconductor memory device according to Comparative Example 2.

As shown in FIG. 11, it is assumed that at time t2, the device determines that for example, 1 bit has passed verification (1 bit pass).

Subsequently at time t3, (a) the magnitude Iw1' of the current flowing through the word line decreases discreetly (Iw1<Iw1'). In connection with current Iw1', a decrease in select bit number from 8 bits to 7 bits results in a voltage drop.

However, in Comparative Example 2, the write voltage is not set by feeding back the reduced bit number. Thus, (b) voltage Vw1−Vb1 applied between the word line and the bit line is kept constant. As a result, (c) the voltage applied to each of the simultaneously selected memory cells increases to Vcell' (Vcell'>Vcell).

Consequently, an extra load may be imposed on the memory cell, leading to destruction of the memory cell itself or miswriting to the memory cell. This disadvantageously degrades reliability. More specifically, the voltage applied to the memory cell increases to make the resistance of the memory cell higher or lower than the target value. This may result in a phenomenon such as overwrite or overerase.

In the above-described embodiments and comparative example, the data write (set) control operation of the semiconductor memory device has been described. However, the present embodiments are not limited to the data write operation but can be similarly applied to a data erase operation (reset) to exert similar effects. For example, as described with reference to FIG. 4, the voltage set during step S102 or S202 is lower and involves a longer application time than the write voltage. Thus, the erase voltage applied to the memory cell group 20 during step S103 or S203 may be applied in step S102 or S202.

Moreover, transition metal oxide may be used as the variable-resistance element. A forming operation that is an initialization operation is required to make the resistance of the transition metal oxide variable. In FIG. 5 and FIG. B described above, the above-described embodiments can be effectively applied to the forming operation by setting, in step S102 or S202, a forming voltage that meets conditions suitable for the forming operation and applying the forming voltage to the memory cell group in step S103 or S203.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for controlling a semiconductor device, the method comprising:
   determining a select bit number for a group of memory cells each comprising a variable-resistance element;
   setting a first voltage corresponding to the select bit number;
   applying the set first voltage to the memory cell group;
   performing verify read on the memory cell group to which the first voltage has been applied and determining whether or not the memory cell group passes the verify read; and
   determining whether or not the select bit number for the memory cell group decreases during the applying the set first voltage, and if the select bit number for the memory cell group decreases, decreasing the first voltage without performing the verify read, and setting the first voltage corresponding to the select bit number again,
   wherein if the memory cell group is determined not to pass the verify read, the number of bits corresponding to passed memory cells is subtracted from the select bit number, and the first voltage corresponding to the decreased select bit number is set again.

2. The method according to claim 1, wherein after the first voltage is set again, the applying the set first voltage to the memory cell and the determining whether or not the memory cell group passes the verify read are repeated.

3. The method according to claim 1, wherein the applying the set first voltage to the memory cell group is carried out for a preset duration.

4. The method according to claim 1, wherein the decrease in the select bit number for the memory cell group corresponds to a change in a resistance state of some memory cells in the memory cell group resulting from the application of the first voltage.

5. The method according to claim 1, wherein the first voltage is not applied to memory cells having passed the verify read.

6. The method according to claim 1, wherein if the select bit number for the memory cell group decreases, the first voltage decreases consistently with the decreased select bit number.

7. The method according to claim 1, wherein the first voltage is one of a set voltage, a reset voltage, and a forming voltage.

8. The method according to claim 1, wherein the first voltage is a voltage pulse.

9. A semiconductor memory device comprising:
a memory cell array in which a group of memory cells each comprising a variable-resistance element is arranged;
a voltage generation circuit configured to generate at least a write voltage for the memory cell array; and
a control circuit configured to determine a select bit number for the memory cell group, set a write voltage corresponding to the select bit number, apply the set write voltage to the memory cell group, perform verify read on the memory cell group to which the write voltage has been applied to determine whether or not all of the select bits pass the verify read, and upon determining that not all the select bits successfully pass the verify read, control the memory cell array and the voltage generation circuit so that the number of passed bits is subtracted from the select bit number to set again a first voltage corresponding to the decreased select bit number,
the control circuit being further configured to determine whether or not the select bit number for the memory cell group decreases during the applying the set first voltage, and if the select bit number for the memory cell group decreases, to decrease the first voltage without performing the verify read, and to set the first voltage corresponding to the select bit number again.

10. The device according to claim 9, wherein after the first voltage is set again, the applying the set first voltage to the memory cell and the determining whether or not the memory cell group passes the verify read are repeated.

11. The device according to claim 9, wherein the applying the set first voltage to the memory cell group is carried out for a preset duration.

12. The device according to claim 9, wherein the decrease in the select bit number for the memory cell group corresponds to a change in a resistance state of some memory cells in the memory cell group resulting from the application of the first voltage.

13. The device according to claim 9, wherein the first voltage is not applied to memory cells having passed the verify read.

14. The device according to claim 9, wherein if the select bit number for the memory cell group decreases, the first voltage decreases consistently with the decreased select bit number.

15. The device according to claim 9, wherein the first voltage is one of a set voltage, a reset voltage, and a forming voltage.

16. The device according to claim 9, wherein the first voltage is a voltage pulse.

17. The device according to claim 9, wherein the memory cell array comprises a plurality of memory cells in a matrix, and the memory cell group is a set of a plurality of memory cells sharing an identical word line.

* * * * *